(12) United States Patent
Gospodinova et al.

(10) Patent No.: US 8,986,790 B2
(45) Date of Patent: Mar. 24, 2015

(54) METHOD OF PREPARING POLYANILINE FILMS AND HIGHLY SELF-ORIENTED FILMS OBTAINED

(76) Inventors: Natalia Gospodinova, Mulhouse (FR); Samuel Dorey, Auriol (FR); Denis Anokhin, Mulhouse (FR); Dimitri Ivanov, Mulhouse (FR); Yuliva Romanova, Sofia (BG); Hristo Kolev, Sofia (BG)

(*) Notice: Subject to any disclaimer, the term of this patent is extended or adjusted under 35 U.S.C. 154(b) by 1206 days.

(21) Appl. No.: 12/736,110

(22) PCT Filed: Mar. 13, 2009

(86) PCT No.: PCT/FR2009/000269
§ 371 (c)(1),
(2), (4) Date: Apr. 5, 2011

(87) PCT Pub. No.: WO2009/115714
PCT Pub. Date: Sep. 24, 2009

(65) Prior Publication Data
US 2011/0281098 A1    Nov. 17, 2011

(30) Foreign Application Priority Data
Mar. 13, 2008 (FR) .................. 08 01390

(51) Int. Cl.
*B05D 3/00* (2006.01)
*H01L 51/00* (2006.01)
(Continued)

(52) U.S. Cl.
CPC ........ *H01L 51/0035* (2013.01); *C08G 73/0266* (2013.01); *C08J 5/18* (2013.01); *C08J 2379/02* (2013.01); *Y02E 10/549* (2013.01)
USPC ...................... 427/385.5; 427/384

(58) Field of Classification Search
USPC .......................... 528/422; 428/220
See application file for complete search history.

(56) References Cited

U.S. PATENT DOCUMENTS 5,008,041 A    4/1991    Cameron et al.
5,095,076 A    3/1992    Clement et al.
(Continued)

FOREIGN PATENT DOCUMENTS

EP    1302506 A1    4/2003
GB    2298210 A    8/1996
(Continued)

OTHER PUBLICATIONS

Dan et al, Journal of Applied Polymer Science, vol. 91, pp. 991-999, 2003.*
(Continued)

*Primary Examiner* — Erma Cameron
(74) *Attorney, Agent, or Firm* — John P. White; Cooper & Dunham LLP

(57) ABSTRACT

The present invention concerns a method for preparing polyanilines by oxidative polymerization of aniline in an aqueous acid medium, comprising at least one synthesis step carried out in the presence of a) a monomer with formula (An) $R_mR_o$—$C_6H_3$—$NHR'$ in which $R_o$, $R_m$ and $R'$ independently of each other, represent H or a linear or branched alkyl, alkoxy, alkylcarboxy or alkylsulfonic group, containing 1 to 6 carbon atoms, b) an acid, c) an oxidizing agent and d) a salt, characterized in that the acid is formic acid. The PANI deposited and dried on a support provides films with 80% of crystalline phase, having a strong alignment of π-π interactions parallel to the surface. The PANI and the films obtained may be used as semiconductors and/or conductors.

14 Claims, 10 Drawing Sheets

(51) Int. Cl.
*C08G 73/02* (2006.01)
*C08J 5/18* (2006.01)

(56) References Cited

U.S. PATENT DOCUMENTS

| | | | |
|---|---|---|---|
| 5,276,112 A | | 1/1994 | Macdiarmid et al. |
| 5,773,568 A | * | 6/1998 | MacDiarmid et al. ........ 528/495 |
| 5,837,806 A | * | 11/1998 | Adams et al. ................. 528/422 |
| 6,509,502 B1 | | 1/2003 | Jussila et al. |
| 6,967,236 B1 | * | 11/2005 | Angelopoulos et al. ...... 528/491 |
| 2007/0249803 A1 | * | 10/2007 | Mattes et al. ................. 528/422 |

FOREIGN PATENT DOCUMENTS

| | | |
|---|---|---|
| WO | WO/99/07766 A1 | 2/1999 |
| WO | WO 2005/108465 A1 | 11/2005 |

OTHER PUBLICATIONS

International Search Report issued by the International Searching Authority (ISA/EPO) on Sep. 4, 2009 in connection with International Application No. PCT/FR2009/000269.

Written Opinion of the International Searching Authority issued by the International Searching Authority (ISA/EPO) in connection with International Application No. PCT/FR2009/000269.

International Preliminary Report on Patentability and Written Opinion of the International Searching Authority, issued by the International Searching Authority (ISA/EPO) on Nov. 2, 2010 in connection with International Application No. PCT/FR2009/000269 with English translation of the Written Opinion of the International Searching Authority.

* cited by examiner

METHOD OF PREPARING POLYANILINE FILMS AND HIGHLY SELF-ORIENTED FILMS OBTAINED

This application is a §371 national stage of PCT International Application No. PCT/FR 2009/000269, filed Mar. 13, 2009, designating the United States, and claims priority of French Patent Application No. 0801390, filed Mar. 13, 2008, the contents of both of which are hereby incorporated by reference into this Application.

BACKGROUND OF THE INVENTION

1. Field of the invention

The present invention relates to a method for preparing polyaniline films, in particular with good charge transport properties in semiconducting and/or conducting films, as well as to the polyaniline (PANI) obtained, and to uses thereof.

2. Description of the Related Art

The creation of novel materials and novel technologies for electronics or optoelectronics in particular is based on researching conjugated polymers with conducting or semi-conducting properties. Organic semiconductors are becoming an alternative to inorganic semiconductors for the development of simple electronics and for the production of such materials in large quantities and cheaply.

For certain applications, one of the major problems is to obtain materials with good uni-directional charge transport properties. As an Example, the development of transistors requires an alignment of π-π interactions parallel to the surface of the semiconductor film, and the results obtained up to now have not been sufficient in this respect.

This is the case with polyaniline, which is one of the best candidates for the various envisaged applications, primarily due to the low cost of the starting monomer, and due to the fact that PANIs are easy to obtain, for example by oxidizing aniline in aqueous solution, and due to the fact that the properties of the PANIs obtained are advantageous: they have thermal and chemical stability, and electronic, optical and optoelectronic properties.

Polyaniline is obtained in the following forms:

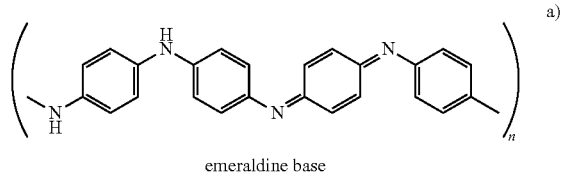

emeraldine base a)

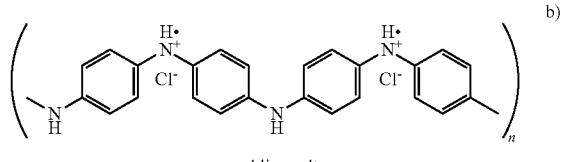

emeraldine salt b)

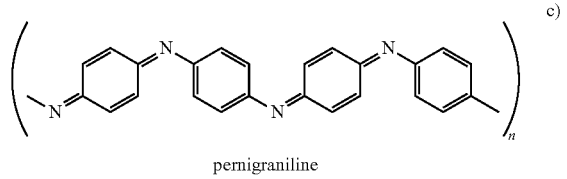

pernigraniline c)

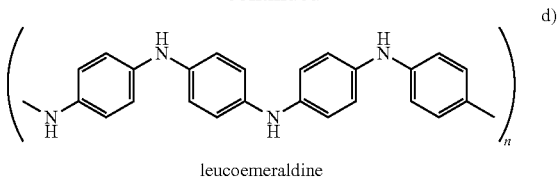

leucoemeraldine d)

The emeraldine base and the last two forms are insulators.

Usually, the organization of the polyanilines is controlled by choosing treatments following polymerization. At the end of the standard polymerization of aniline, semi-crystalline polyaniline (emeraldine salt) is obtained in the form of an insoluble and infusible powder. In order to obtain orientated films, various treatments carried out after polymerization, or "post-polymerization treatments" or "post-treatments" have been envisaged and several of those treatments are indispensable: neutralization, washing, drying, dissolution in appropriate organic solvents or post-protonation with organic sulphone-containing organic acids, and drying on a support followed by stretching of the films obtained. Polymer fibres may also be obtained by extrusion, stretching, etc.

Until now, two principal approaches for obtaining crystalline films based on π-conjugated oligomers or polymers have been envisaged. The first consists of evaporating π-π conjugated polymers under vacuum. The second is based on the use of solutions of soluble derivatives.

It is thus known to dissolve emeraldine base in N-methylpyrrolidone (NMP) and to orientate the film by stretching it, the NMP acting as a plasticizer. It is also known that, when protonated by camphorsulphonic acid (ACS), polyaniline is partially soluble in meta-cresol, which means that films can be obtained by evaporation of meta-cresol. However, all of the pathways employed until now to obtain such associated polyaniline chain forms necessitates and brings about the destruction of its native semi-crystalline organization.

The degree of crystallinity of the films obtained does not usually exceed 40% in general.

In order to illustrate this prior polymerization technique, usually carried out in the presence of Cl⁻, U.S. Pat. No. 5,276,112 may be cited; it describes a method for manufacturing PANIs by polymerization using ammonium persulphate, in which a first solution comprising aniline, a protonic acid, a salt and a second solution comprising an acid, a salt and ammonium persulphate as a polymerization agent are mixed, then the PAM precipitates out and it is washed. The protonic acid is selected from HCl, HBr, HI, HClO$_4$, H$_2$SO$_4$, H$_3$PO$_3$ and CH$_3$COOH. The PANI may be dissolved in various solvents to form it into a film or a fibre. In order to obtain the film, the solvent is evaporated off.

Further, in order to overcome the problem linked to the presence of chlorine in the PANIs obtained and/or to the use of LiCl or Cl⁻ during polymerization, US-2007/0249803 describes the use of formic acid in the polymerization of PANIs with a high molecular weight which are free of chlorine. The polymerization of aniline is carried out in the absence of chlorine and in the absence of salts intended to lower the freezing point using a non-chlorinated acid at concentrations where it prevents the medium from freezing. More precisely, it describes the polymerization of aniline carried out at −25° C. in the presence of ammonium persulphate, in the absence of salt capable of lowering the freezing point of the polymerization medium, in the presence of formic acid in quantities of approximately 10 or even 20 times higher than that of the aniline used, followed by deprotonation carried out using an ammonium hydroxide solution, and washing of the polyaniline powder is carried out with water then with 2-propanol.

There is a need for films of highly crystalline and self-orientated PANI that can be used without post-treatment other than drying, or without a residue of processing agent or film-forming agent. The Applicant has demonstrated that by making a particular selection of the conditions for carrying out the method for oxidative polymerization in an aqueous acid phase, films can be obtained directly after synthesis which have a strong orientation of π-π interactions parallel to the surface of the film.

BRIEF SUMMARY OF THE INVENTION

Thus, the present invention concerns a method for preparing polyanilines by oxidative polymerization of aniline in an aqueous acid medium, comprising at least one synthesis step carried out in the presence of a) a monomer with formula (An) $R_m R_o$—$C_6 H_3$—$NHR'$ wherein $R_m$, $R_o$ and R', independently of each other, represent H or a linear or branched alkyl, alkoxy, alkylcarboxy or alkylsulfonic group, containing 1 to 6 carbon atoms, b) an acid, c) an oxidizing agent and d) a salt, in which method the acid used is formic acid.

Using the method of the invention, highly crystalline and self-orientated films of PANI are obtained directly after synthesis. The synthesis step may be followed by a step for separating the PANI obtained in the synthesis step in order to obtain a film by depositing the separated PANI on a support. The separated PANI may be washed. The synthesis step may be followed by a step for drying the PANI obtained in the synthesis step, on a support. The term "directly after synthesis" means without post-treatment other than filtering, washing or drying, in other words without mechanical post-treatment. The post-treatments usually used in the prior art include neutralization, dissolution, re-protonation and/or stretching. Stretching is usually applied in order to improve the orientation.

In addition to the fact that the films obtained have a strong orientation of π-π interactions parallel to the surface, they have good homogeneity and very good compactness. Roughness measurements have shown that the surface of the film in contact with glass may be of the order of 4 Angstroms (0.4 nm).

The method of the invention may be used to obtain PANIs that are free of dissolution or post-treatment residues, in particular of the methylpyrrolidone or cresol type (cresol, metacresol, etc), in other words without post-treatment solvent, without plasticizing acid or other processing additives.

The particular choice of the synthesis pathway, in particular the use of formic acid, in the presence of chloride(s) of alkali or alkaline-earth metals, in particular NaCl, LiCl, KCl, $CaCl_2$ or mixtures thereof, can be used to form nano-crystals of polyaniline during the oxidative polymerization of aniline. Films are obtained during a simple drying of the suspension of nano-crystals of polyaniline deposited on a support. The term "simple drying" means a spontaneous reorganization during film formation. The destruction of aggregates and self-assembly of nano-crystallites of PANI obtained during synthesis has been observed; this produces particularly anisotropic films of PANI. This reorganization results in the formation of films, in particular thick films.

The present invention concerns PANI which spontaneously forms films. The PANI of the invention is substantially free of post-treatment solvent. It is also free of plasticizer.

The term "spontaneously film-forming" means that the PANI is capable of forming a film without the application of a mechanical treatment. The film is formed without carrying out a dissolution step. The film is formed without the usual steps of neutralization, dissolution or re-protonation, and it is orientated without stretching, i.e. it is highly orientated without stretching being necessary. Depositing it on a support to dry it which, in accordance with the invention, results in a strong orientation of chains without applying a mechanical treatment, is also not considered, in accordance with the invention, to be an applied mechanical treatment. In contrast, in the usual prior art methods, a mechanical treatment is necessary in order to obtain orientated films.

The present invention concerns films of PANI having no less than 50%, preferably at least approximately 70% and moreover of the order of approximately 80% of crystalline phase. They exhibit a strong alignment of π-π interactions parallel to the surface. The conductivity of these films is of the order of 100-150 S/cm.

The highly orientated films of the invention may have thicknesses of the order of 30 to 300 μm. They may be obtained directly after synthesis of the polyaniline, by simple drying. In this manner, the films are substantially free of plasticizer. They may be prepared without stretching. They are free of dissolution residue. The films obtained may comprise more than 80% of PANI with its counter-anion and water. This has been demonstrated by the results in terms of roughness; the films obtained are highly homogeneous.

The chains of PANI are orientated therein, the nuclei being perpendicular to the surface of the film. This is apparent from the diffractograms obtained. The diffractograms also reveal the anisotropy of the films obtained.

In films with a thickness of less than approximately 100 μm, it has been shown that the direction of the PANI chains is parallel to the surface of the film. For larger thicknesses, the chains "stand up"; in other words, at least over wide zones, they are substantially parallel to each other and substantially perpendicular to the surface.

It thus appears that particularly advantageous results can be obtained: films with a semiconductive nature as regards the properties measured parallel to the surface (transport of charges injected parallel to the surface) and of a conductive nature in the thickness of the films, in concomitant manner.

The PANI of the invention is particularly anisotropic as regards its conductive and semiconductive properties. Electrons are transported in the direction of the PANI chains. Furthermore, there is transport of charges injected in the direction of the π-π interactions. In films sufficiently thick for it to be able to be measured, semiconductivity can be discerned in the direction of injected charges, and conductivity in a perpendicular direction.

Regarding the orientation of the films, from the diffractogram, the orientation parameter of the films, estimated in accordance with the Herman method (Alexander L E, in X-ray diffraction methods in polymer science; Robert E Krieger; Huntington, N.Y., 1979; Ch. 4, pp 210-211, or Heffelfinger C J, Burton R L J, Polym Sci, 1960, 289) for the films of the invention, is of the order of 0.8 or more, in particular of the order of 0.84. By comparison, for isotropic powder, this parameter may even be negative.

Thus, using the method of the invention, films and materials can be obtained wherein the direction of electron transport is parallel to the thickness (chain direction) and the direction of injected charges is parallel to the surface (direction of π-π interactions).

In addition to these thick films deriving from precipitated aggregates, thin films of highly organized polyaniline, i.e. crystalline and orientated films, which are also transparent, may be obtained by depositing polymer onto a solid support during polymerization of aniline under the polymerization conditions described in the present application.

The thin films are formed during polymerization of the aniline, by adsorption of primary nano-crystals onto the surface of a solid support immersed in the reaction medium.

These films are herein termed "thin" compared with the "thick" films (30 to 300 µm) which are formed from PANI precipitated in the form of macroscopic aggregates of nanocrystallites, by self-assembly or spontaneous reorganization of nano-crystallites during drying of a suspension of PANI obtained by precipitation during synthesis.

Thin films in accordance with the invention have been obtained on a support by immersing supports having a deposition surface which is preferably hydrophilic in the polymerization reaction medium. The support(s) preferably comprise at least one flat or substantially flat surface. Any solid support such as glass, silicon, mica or polymer, may be suitable. They may be plates. Thus, the term "support" means any continuous or dispersed substance which is substantially planar on a molecular scale. In other words, the supports described in the examples are plates but this definition may also include supports of particulate solids such as powders.

The supports immersed in the polymerization reaction medium are withdrawn, and a thin film of PANI is observed. After washing in an acid solution, they are dried.

The thin films adhere strongly to the supports and remain intact after immersion in aqueous media at various pHs and in an organic medium. The term "long term immersion" means immersion which may last up to three months or more.

The highly orientated thin films of the invention may have thicknesses which are, for example, of the order of 20 to 100 nm. The thickness depends on the polymerization time. In approximately 1 h, 80 nm films are obtained. It has been observed that, depending on the polymerization time or immersion time in the polymerization medium, thin films with a thickness in the range 10 to 250 nm may be obtained.

The thin films may be obtained directly during the polyaniline synthesis. They may be produced in the same reactor and at the same time as the formation of the precipitated PANI which can form "thick" films.

In thin films with a thickness of less than approximately 100 nm, it has been shown that the direction of the PANI chains is parallel to the film surface.

It has been shown that the films obtained thereby on a support are highly orientated.

These highly advantageous results, which can be observed in diffractograms, have been obtained in a reproducible manner.

The present invention also concerns the application of the PANIs obtained in all the usual applications, more particularly in the form of films, as a semiconductor. It also concerns the application of the PANIs obtained for all the usual uses and more particularly in the form of films, as a conductor. Finally, it concerns the application of the PANIs obtained in all the usual uses and more particularly in the form of films, as a semiconductor and at the same time as a conductor.

The PANI of the present invention proves to be easier to dissolve in the usual solvents for polyaniline than PANI obtained in the usual manner, in particular in N-methylpyrrolidone or sulphonic acids.

The invention and its advantages will be better understood from the following description, examples and results obtained made with reference to the accompanying drawings in which:

BRIEF DESCRIPTION OF THE DRAWINGS

FIG. 13 diagrammatically shows an implementation of the method of the invention;

FIG. 14 shows a two-dimensional X ray diffractogram in transverse mode of a thin film of PANI with a thickness of 80 nm obtained by the method of the invention;

FIGS. 15-A and 15-B show transmission UV-VIS spectra of a thin film of PANI obtained in accordance with the invention, with a thickness of 80 nm deposited on a glass support; A: after polymerization and B: after drying respectively;

FIG. 16 diagrammatically represents the reversible decolorization of a film of PANI of the invention on contact with a steel bar.

DETAILED DESCRIPTION OF THE PREFERRED EMBODIMENTS

The term "aniline monomer" as used below means any monomer of the aniline type with formula (I) $R_m R_o$—$C_6 H_3$—NHR' in which $R_m$, $R_o$ and R', independently of each other, represent H or alkyl, alkoxy or alkylcarboxy or alkylsulphonic, linear or branched, containing 1 to 6 carbon atoms. Examples which may be cited are monomers such as N-methylaniline, o-toluidine, m-toluidine, o-butylaniline, o-methoxyaniline and the like. Preferably, in formula (I), $R_o$ and $R_m$ are in the ortho or meta position of the cycle, and leave the para position on the nucleus free. Preferably, $R_o$ or $R_m$ represent $CH_3$ and the other and R' represent H.

More preferably, $R_o$, $R_m$ and R' represent H and formula (I) represents aniline proper, $C_6H_5$—$NH_2$, which is the archetype of formula (I) and to which the examples and the method of the invention pertain, i.e. its operational conditions; however, they may be adapted by the skilled person to other described monomers.

Figure 1:
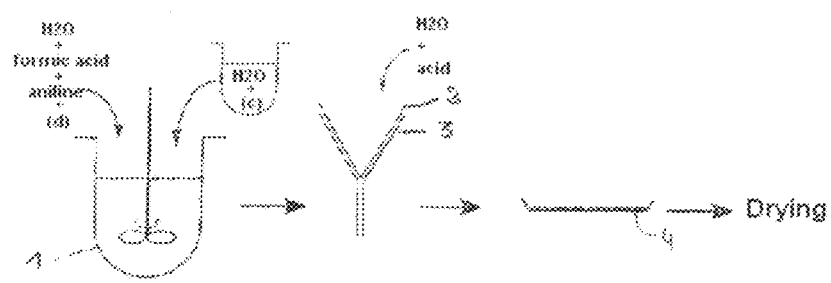
FIG. 1 diagrammatically represents an implementation of the synthesis method of the invention.

In order to carry out the method, the operation shown in FIG. 1 may be followed: distilled water, formic acid, salt d) and aniline monomer are introduced consecutively into a polymerization reactor 1 to prepare the saline solution. Oxidizing agent c), for example ammonium persulphate, preferably pre-dissolved in water, is added to the saline solution of aniline. Polymerization occurs.

The concentration of formic acid in the polymerization medium is, in accordance with the invention, in the range 0.5 to 15 mol/L, preferably in the range 1 to 7 mol/L and more preferably in the range 4.5 to 5.5 mol/L. Still more preferably, it is approximately 5 mol/L.

Preferably, the pH of the polymerization medium is 2 or less, preferably less than 1.5.

The term "salt" as used in the invention means the salts $MX_x$ where M represents Li, Ca, Na or K and X represents F, Cl or Br, x representing 1 or 2 depending on the valency of M. Preferably, M represents Li, Ca or Na, more preferably Li. Preferably, X represents Cl or Br. The salts may be used as mixtures.

More preferably, the chloride is used. The particular choice of the conditions for polymerization in the presence of formic acid in combination with chloride(s) is particularly important. Preferred chlorides are NaCl, LiCl, KCl and $CaCl_2$ and mixtures thereof, and of these, the preferred salt for use in the invention is LiCl.

The concentration of salt depends on its solubility. It may vary between 2.3 mol/L for KCl, the least soluble, to 6.4 mol/L for LiCl, the most soluble. The concentration of salt as used in the invention in the polymerization medium may be in the range 2 to 7 mol/L, preferably a minimum of 3.5 mol/L, and may go up to saturation of the medium with the salt. It depends on the salt employed. For NaCl, it is preferably in the range 3 to 4.5. For LiCl, the concentration in the polymerization medium is preferably in the range 4 to 6 mol/L.

The oxidizing agent employed may be any suitable oxidizing agent, preferably strong, soluble in aqueous medium, and wherein the reduction products are soluble in an aqueous medium more precisely in the polymerization medium, of the permanganate, chromate or peroxide type. Preferably, an oxidizing agent is used which is selected from ammonium persulphate $(NH_4)_2S_2O_8$, $Kr_2Cr_2O_7$, $KIO_3$, $KMnO_4$ or the like, and mixtures thereof. Preferably, ammonium persulphate, $(NH_4)_2S_2O_8$, is used.

The polymerization may be carried out at an aniline concentration in the range 0.001 to 0.2 mol/L, preferably in the range 0.007 to 0.15 mol/L. Preferably, the concentration of aniline in the polymerization medium is substantially in the range approximately 0.009 to approximately 0.05 mol/L, in particular in the range approximately 0.01 to 0.04 mol/L.

In accordance with the invention, the oxidizing agent/aniline ratio may be in the range 0.5 to 5, preferably in the range 0.9 to 1.5. Preferably, it is substantially stoichiometric.

In a particular implementation, the aniline is present in an amount of approximately 0.01 mol/L, with a stoichiometric oxidizing agent/aniline ratio.

The polymerization period may vary with temperature and the concentrations of reagents used in the polymerization medium. As an Example, at 0° C., it is in the range 0.5 to 6 h, especially in the range 2 to 6 h or in the range 0.5 to 1.5 h, varying in particular as a function of the concentration of aniline.

The conversion of aniline to polyaniline is approximately 80%. The reduction in the polymerization temperature results in an increase in the degree of crystallinity of the polyaniline films.

The temperature of the polymerization medium varies as a function of the selected constituents a) to d), their concentration and ratios. It is typically in the range $-35°$ C. to $10°$ C. and may be in the range $-35°$ C. to $-5°$ C., but polymerization may also be carried out at a temperature of the order of $4°$ C. to $6°$ C. As will become apparent in the examples, it varies in particular with the salts selected. The use of salts, especially chlorides, that are the most soluble ($Li^+$ and $Ca^{2+}$), can reduce the temperature to approximately $-35°$ C.

The polyaniline powder may be separated from the reaction medium using any suitable means, for example simply by filtering the suspension of polyaniline derived from polymerization. It is possible to use any filtering device, for example a filter 2 disposed in a funnel 3.

The powder is washed with an acid solution, preferably at a pH of less than 2. The washing acid is preferably formic acid, at an appropriate concentration, but other routine acids, for example hydrochloric acid, may be used for washing. Preferably, formic, acetic, sulphuric or phosphoric acids are used for washing. It has been shown that rinsing with hydrochloric acid does not allow such films to be produced.

It is possible to use a solution of formic acid in a concentration of 5 mol/L, for example. Washing may take place directly on the filter.

The wetted powder may contain approximately 10% by weight of polyaniline. The presence of aggregates of nanocrystals has been observed therein.

The powder deposited on a support 4 is transformed into a glossy film that detaches itself from the support when it is dried.

The term "drying" means evaporation of the polymerization medium, under vacuum or at atmospheric pressure. Drying may be carried out at any pressure and temperature appropriate for the PANI. Thus, at atmospheric pressure, drying may in particular be carried out in the range $5°$ C. to $140°$ C., preferably in the range ambient temperature to $85°$ C., more preferably in the range $75°$ C. to $85°$ C., preferably at approximately $80°$ C., for example in an oven. Under reduced pressure, drying may, for example, be carried out at temperatures of the order of approximately $5°$ C. to $30°$ C., preferably in the range approximately $15°$ C. to $25°$ C. Drying may be partially carried out during filtering of the polymerization medium, for example with a vacuum pump connected to the filter. Drying may be carried out entirely or partially on the support to obtain a film.

As will become apparent from the examples, the surface roughness of such a film is of the order of 0.3-0.7 nm on the micronic scale. It may be of the order of 7 nm on the macroscopic scale. A roughness of the order of 0.4 nm has been measured on the 5 micron scale.

The thickness of the films obtained varies as a function of the quantity of the polyaniline deposited per unit surface area of the support. It has been shown that a quantity of powder of approximately 0.01 $g/cm^2$ can produce a dry film with a thickness of the order of one micron. With 0.6 $g/cm^2$ of PANI, a film approximately 45 μm thick has been obtained. The thickness may vary between 40 and 300 microns.

Films of polyaniline with such characteristics (strong orientation, degree of crystallinity reaching 80% and more, conductivity of dry films of the order of 100-150 S/cm, or even 120-150 S/cm) may be obtained on any appropriate, normal support. The surface of the support may, for example, be constituted by glass, silica, and various polymers such as polystyrene, polytetrafluoroethylene, polyethylene, etc.

The drying time varies as a function of temperature, film thickness, preliminary filtering and applied pressure. It may be of the order of 1 h to 6 h.

In a typical and preferred implementation, the method of the invention can be used to produce polyaniline (PANI) by oxidative polymerization of aniline in the presence of formic acid (approximately 5 M, pH approximately 1.45) and lithium chloride, LiCl. The concentration of aniline introduced is approximately 0.04 mol/L. The oxidizing agent employed is ammonium persulphate; it is introduced in a concentration similar to that of the aniline (approximately 0.04 mol/L). The concentration of LiCl salts is approximately 6.4 M. The synthesis temperature is of the order of −35° C. The medium remains liquid; only the PANI precipitates out. The powder is separated by filtering then washed with an approximately 5M solution of formic acid. The suspension is deposited on a glass support and dried at 80° C. The film detaches itself from the support when drying is complete.

The present invention also concerns a method for preparing a film of polyanilines on a support by oxidative polymerization of aniline type monomers in an aqueous acid medium, characterized in that the oxidative polymerization of the monomer is carried out in a polymerization medium comprising a) a monomer with formula (An) $R_m R_o$—$C_6 H_3$—NHR' in which $R_m$, $R_o$ and R', independently of each other, represent H or a linear or branched alkyl, alkoxy, alkylcarboxy or alkylsulfonic group, containing 1 to 6 carbon atoms, b) an acid, c) an oxidizing agent and d) a salt, the acid being formic acid, and at least one solid support comprising at least one surface that is preferably hydrophilic is disposed in the polymerization medium, and the support or supports carrying the film is or are recovered.

As indicated above, the destruction of aggregates of the suspension of polyaniline nano-crystals deposited on the support is observed, along with self assembly of the synthesized PANI nano-crystallites, this leading by simple drying to particularly anisotropic films of PANI. These films obtained from PANI precipitated in the form of aggregates have a thickness of 30 to 300 μm and are termed "thick" films.

Thin films are obtained by immersing solid support(s) in a polymerization reactor into which distilled water, formic acid, the salt and aniline have been introduced and wherein the oxidizing agent such as ammonium persulphate which has been dissolved in water is added to the solution thus obtained. After mixing, one or more solid support(s) is (are) immersed in the reaction medium. During polymerization of the aniline, primary nano-crystals of polyaniline form, followed by their adsorption and growth on the immersed solid support.

The supports covered with layers of polyaniline are removed from the reaction medium then rinsed with acid solution and dried. The drying time varies as a function of the temperature, the film thickness and the applied pressure. It may be of the order of 1 h to 6 h.

The rinsing step is carried out with an acid solution, preferably formic acid, at an appropriate concentration, preferably in the range 5 to 10 mol/L, but other acids with strong hydration, for example acetic, sulphuric, sulphonic or phosphoric acid or mixtures thereof, may be used for rinsing. Preferably, a 5 mol/L solution of formic acid is used.

The polyaniline films may be obtained on any appropriate, usual support comprising at least one flat surface. Preferably, the supports or their surface exposed to the polymerization medium are hydrophilic. Preferably, the hydrophilic surface has a contact angle with water of less than 80°.

It thus appears that particularly advantageous results may be obtained by the combination of transparency and conductivity in these highly crystalline and transparent thin films.

Thus, the present invention more particularly concerns applications in the fields of optical and optoelectronic sensors and in the photovoltaic and electrochromic fields.

Highly organized and transparent films exhibit a property that is remarkable in conductive polymers. Thus, a film of polyaniline can be decolorized during simple contact with a rod of steel as soon as it is immersed in a solution at a pH of <3. This decolorization propagates in a few seconds, forming a circle around the rod. The diameter of this circle is much greater than the diameter of the rod. When the rod is removed, a return to the initial color is observed.

In known manner, the non-coloured polyaniline may be obtained by chemical (or electro chemical) reduction of semi-oxidized polyaniline (green) or oxidized polyaniline (violet). However, the propagation of such a process has never been detected or observed for films of polyaniline obtained by depositing polymer on a support during conventional polymerization. In contrast, it is observed for the thin films of the invention.

The reduction of polyaniline, probably linked to the reaction with atomic hydrogen formed during the oxidation of iron in the acid medium, propagates on a macroscopic scale by means of the facility with which electrons are transported in a highly organized conductive polymer.

Figure 13:
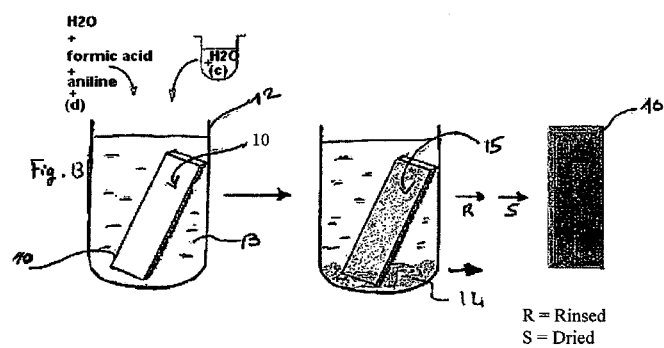
FIGS. 13 to 16 illustrate the implementation of the invention concerning thin films. It is described in more detail in examples 13 ff.

In a typical implementation as illustrated in FIG. 13, the method of the invention can be used to produce thin films of polyaniline (PANI) by oxidative polymerization of aniline in the presence of formic acid (approximately 5 M, pH approximately 1.45) and lithium chloride, LiCl. The concentration of aniline introduced is approximately 0.04 mol/L. The oxidizing agent employed is ammonium persulphate; it is introduced at a concentration similar to that of the aniline (approximately 0.04 mol/L). The concentration of LiCl salts is approximately 6.4 M. The temperature of the synthesis is of the order of −35° C. A glass plate which is inclined to the vertical is introduced. The medium remains liquid; only the PANI precipitates and then is adsorbed as a thin film onto the immersed glass plate.

The film is rinsed with an approximately 5 M formic acid solution.

The completion of synthesis corresponds to the moment at which a film of polyaniline of the desired thickness is obtained. This latter may be determined by the absorbance of films (for films which are not dried it is determined at a wavelength of 800 nm where it is a maximum) measured by UV-VIS spectrophotometry in "transmission" mode for transparent supports and in "reflection" mode for non-transparent supports. The absorbance of films with a thickness of 30 nm is approximately 0.07 and that of films with a thickness of 80 nm is 0.5. It has been observed that the dependency of the absorbance of the films as a function of their thickness is linear.

EXAMPLE 1

PANI. The polyaniline (PANI) was obtained by oxidative polymerization of aniline in the presence of formic acid (5M, pH=1.45) and lithium chloride, LiCl, in an aqueous medium. The concentration of aniline introduced was 0.04 mol/L and the oxidizing agent employed was ammonium persulphate, introduced at the same concentration (0.04 mol/L in the polymerization medium), and the concentration of LiCl in the polymerization medium was 6.4 M. The synthesis was carried out at a temperature of −35° C. The first step of the synthesis consisted of providing, in two different vessels, the aqueous solution with the aniline in one and the oxidizing agent in the other. The two vessels were combined and the mixture was homogenized. The medium remained liquid; only PANI had precipitated over 2 to 3 hours. The powder was separated by filtering, then washed with a 5 M formic acid solution.

Figure 4:
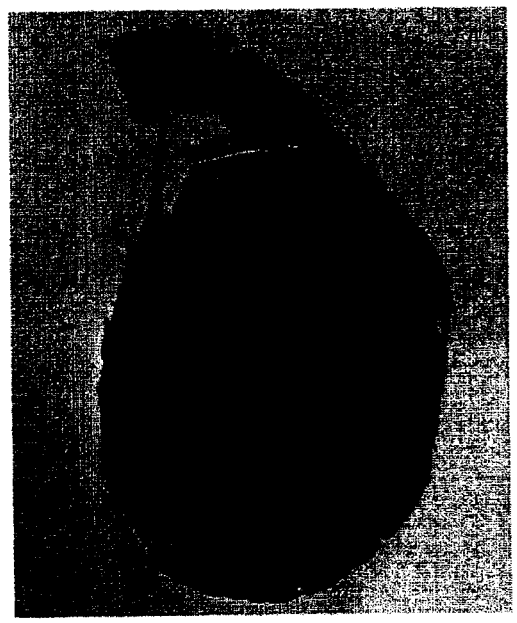
FIG. 4 is a photograph of a film of PANI obtained in accordance with the invention by drying at 80° C. on glass.

Film. A film was obtained by depositing the PANI suspension (approximately 0.6 g of PANI per cm$^2$) on a glass surface. The concentration of the PANI suspension was approximately 10% by weight. The thickness of the film obtained was 45-50 μm. After producing the diffractogram, the Herman factor was of the order of 0.8±0.05. The film detached itself spontaneously from the glass when drying was complete. FIG. 4 shows a photograph.

EXAMPLES 2 to 8

Example 2

17.3 mL of water, 4.7 mL of formic acid, 6 g of sodium chloride (NaCl) and 0.1 mL of aniline were introduced into a 30 mL flask. 0.2 g of ammonium persulphate was dissolved in 3 mL of water. The flasks were cooled in an ice bath for 10 min. The ammonium persulphate solution was then poured into the flask, with stirring. Polymerization was carried out for 0.5 h at a temperature of 4-6° C. The conversion of aniline to polyaniline was approximately 80%. When polymerization was complete, the suspension was filtered over filter paper and the polyaniline powder was washed with a solution of formic acid to eliminate the salts. The suspension containing approximately 10% by weight of polyaniline was spread over a glass and allowed to dry at 80° C. A film of polyaniline with a thickness of 70 microns and a degree of crystallinity of 70% was obtained after drying for 2 hours, for a quantity of 0.1 g/cm$^2$ of deposited polyaniline.

Conductivity of film: 100 S/cm. After producing the diffractogram, the Herman factor was of the order of 0.8±0.05.

TABLE 1

Freezing points ($T_f$) and corresponding concentration ($C_f$) and solubility of salts at 0° C.

| Salt | $T_f$, ° C. | $C_f$, mol/l | Solubility at 0° C., mol/L |
|---|---|---|---|
| CaCl$_2$ | −55 | 3.46 | 5.40 |
| LiCl | −74 | 7.46 | 13.60 |
| NaCl | −21.2 | 4.63 | 6.11 |
| KCl | −11.5 | 3.03 | 3.70 |

The method of Example 2 was reproduced under the following conditions:

Conditions for polymerization of aniline resulting in the production of films of highly crystalline and self-orientated polyaniline

| Ex | Conc'n of aniline, mol/L | Salt type | Conc'n of salt Mol/L | Polymerization temperature, ° C. | Degree of crystallinity of films "Xc"*, % |
|---|---|---|---|---|---|
| 3 | 0.01 | KCl | 2.3 | 0 | 50 |
| 4 | 0.01 | NaCl | 4.2 | 0 | 65 |
| 5 | 0.04 | NaCl | 4.2 | 0 | 75 |
| 6 | 0.04 | NaCl | 4.2 | 6 | 75 |
| 7 | 0.04 | CaCl$_2$ | 4.2 | −35 | 60 |
| 8 | 0.04 | LiCl | 6.4 | −35 | 80 |

*The inverted commas indicate that the degree of crystallinity was under-estimated. It was in fact calculated from one-dimensional diffractograms measured on the orientated films using the method given below.

EXAMPLE 9

Figure 2:
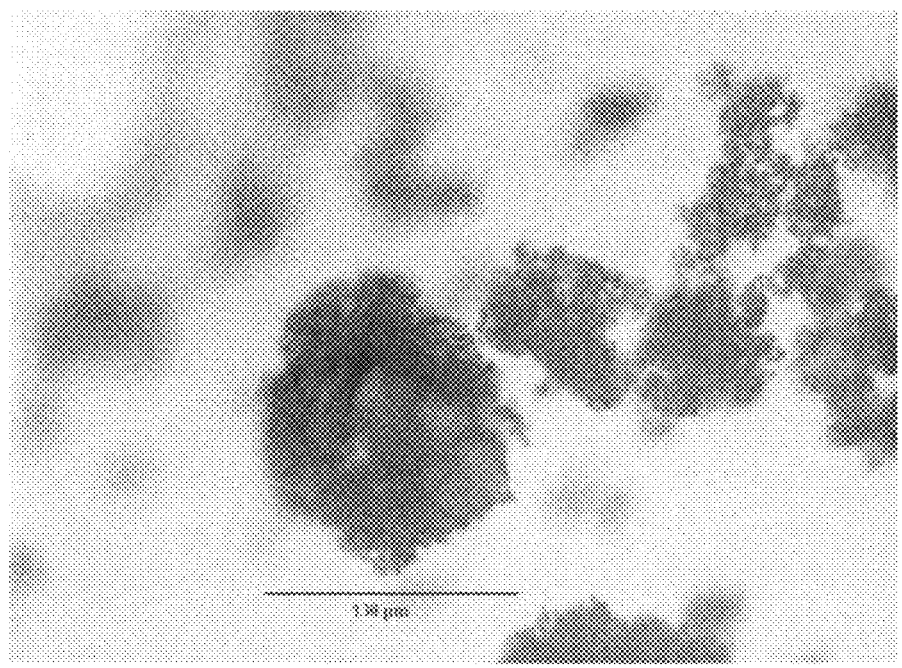
FIG. 2 is an optical microscope image of a suspension of a PANI obtained by the method of the invention.

1. Methods and Apparatus
  a) In order to study the morphology of the PANI before obtaining the film, PANI powder was re-dispersed and analyzed using several microscopic methods.
    The images recorded using optical microscopy were taken in white light and with a zoom of ×20.
  b) The transmission electron microscopy micrographs were obtained using a Philips CM200 instrument.
  c) The morphology of the surface of the PANI samples was characterized by atomic force microscopy in tapping mode (AFM-TP). This technique can be used to produce topographical images and information regarding the roughness and phase images. The measurements were recorded using a Digital Images Multimode instrument with Veeco Super Sharp Tips (model TESP-SS) with a radius of curvature of 2 nm. The images were produced at ambient temperature in air.
  d) The crystalline structure of films of PANI was probed by wide angle x ray diffraction (WAXS). The instrument employed was a Philips X'Pert. The images obtained in two-dimensional WAXS in glancing angle mode were obtained on a Beamline X6B instrument from National Synchrotron Light Source, which is part of the Brookhaven National Laboratory (United States). The conductivity was measured using a standard 4-point method.
  e) The UV-VIS spectra were produced using a Lambda 1500 UV-VIS spectrophotometer (Perkin Elmer).
2. Results
2.1 Change in Morphology of System During Drying After polymerization and washing in Example 1, the PANI was re-dispersed in a solution of formic acid. The suspension which contained approximately 1% of PANI was deposited on a glass support. The morphology of the suspension was studied with an optical microscope (see a) above). As can be seen from FIG. 2, large aggregates were observed, which could reach a size of 130 μm. These aggregates were composed of smaller, spherical particles with a size of approximately 2 μm.

Figure 3:
FIG. 3 shows four images, 3-1 to 3-4, obtained by optical microscopy for a suspension of PANI obtained by the method of the invention during drying at ambient temperature on a glass support. The image in FIG. 3-1 was recorded at a time $t_0$; the image in FIG. 3-2 was recorded at a time of 3 min, the image of FIG. 3-3 was recorded at a time of 8 min and the image of FIG. 3-4 was recorded at a time of 2 h 30 min.

The same suspension was observed during drying at ambient temperature on a glass support and the observation was focussed on a zone of the sample where an aggregate was visible. The formation of a film with time was observed using optical microscopy; see images 3-1 to 3-4 of FIG. 3, taken at time t$_0$, 3 min and 1 s, 8 min and 15 s and 2 h 31 min and 57 s respectively. It can be seen that the volume of the aggregates decreased during drying. The size of the aggregates reduced by half (from 150 to 75 μm). This spontaneous dis-aggregation was followed by compacting of the material to form the film of PANI.

A change in the colour of the sample was also observed, from a green colour (image 1) to a blue tint (image 3) and finally turned violet (image 4).

Figure 5:
FIG. 5 principally shows a TEM (transmission electronic microscopy) microscope image of an aggregate of the suspension of polyaniline obtained by the method of the invention; a magnified image is shown at the top right.

2.2) Using transmission electronic microscopy (see b) above), using the image of an aggregate as observed above, the presence of the small objects making up the particles was observed: the objects were elongate in shape with a dimension of approximately 15 nm by 8 nm; the particles corresponded to nano-crystallites of PANI. FIG. 5 shows an aggregate of the suspension of PANI after synthesis. The zoom image is of one nano-crystallite.

Figure 6:
FIG. 6 shows the 2×2 AFM image of the surface of a film of FIG. 4 obtained by the method of the invention formed in contact with glass.

2.3) The morphology of the film of PANI obtained in Example 1 and photographed in FIG. 4 was probed by atomic force microscopy (see c) above). The images in FIG. 6 were obtained in tapping mode. Image 1 represents the topography and image 2 the phase.

Image 1 reveals the particles with a size of approximately 20 nm. The low height contrast signifies high homogeneity and compactness of the film. A measurement of the roughness of the surface of the film in contact with the glass was carried out and provided a mean roughness of 4 Å. This value was valid as measurement in the z axis of AFM is very accurate.

2.4) Characterization of the crystalline structure of the film of PANI by WAXS (wide angle X ray scattering) analysis (see d) above). The diffraction measurements in reflection mode and in transmission mode were made on the film of PANI synthesized by the novel polymerization pathway (HCOOH 5 M, LiCl 6.4 M, −35° C.) of Example 1.

For comparison, the diffraction was carried out in reflection mode for the "conventional" PANI obtained by conventional polymerization (HCl 1.5 M, replacing HCOOH), which resulted in a powder of PANI, in contrast to the novel synthesis pathway which could be used to form a film.

The "conventional" pathway was carried out with the same conditions: concentration of aniline, aniline/oxidizing agent ratio, temperature, pH, the result being similar with or without 6.4 M LiCl.

Figure 7:
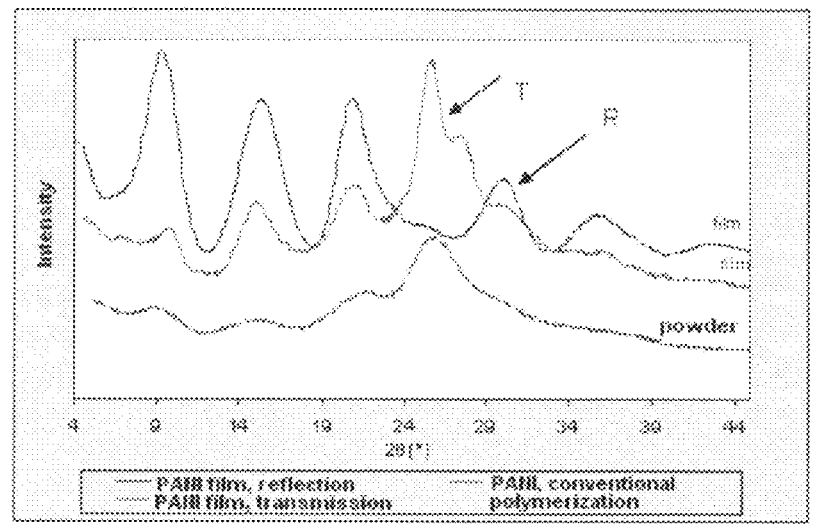
FIG. 7 shows WAXS diffractograms for a film of PANI prepared using the method of the invention (HCOOH-chlorides), in reflection and transmission mode and, for comparison, in reflection for PANI prepared in the usual manner (HCl)

The two samples were dried on glass at 80° C. The diffractograms are shown in FIG. 7.

For conventional PANI, the peak at 25.3° (3.5 Å) was of high intensity while that at 9.3°, 15.1° and 20.7° (d=9.5, 5.8 and 4.3 Å) were more diffuse. The conventional PANI had an apparent crystallinity of approximately 30%. The diffractograms in transmission mode and in reflection mode for the "conventional" PANI were identical.

The film of PANI in accordance with the invention displayed strong anisotropy. In reflection, peaks were observed at 9.3°, 15.1° and 20.7° (d=9.5, 5.8 and 4.3 Å) while the peak at 25.3° (3.5 Å) had a very diffuse shoulder. The film when probed in transmission mode provided different information. The peak at 25.3° (3.5 Å) had an extremely intense reflection while retaining the other three reflections, but at a lower intensity. The crystallinity of the film was approximately 70%.

EXAMPLE 10

Organization and Thickness of Film

Figure 8:
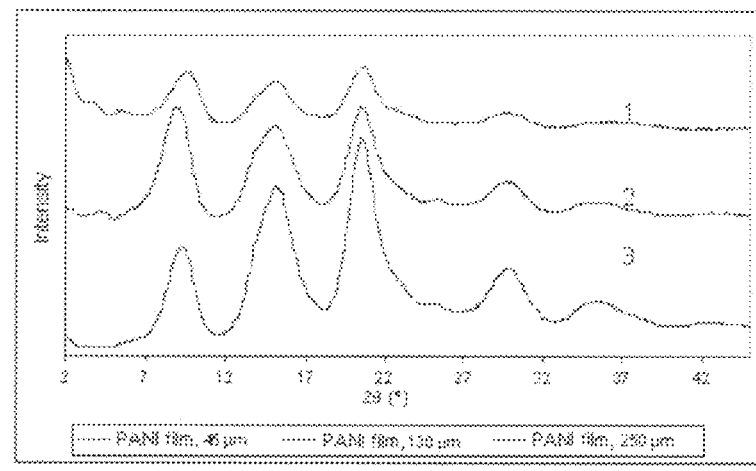
FIG. 8 shows WAXS diffractograms of the surface of a film formed in contact with glass and for PANI films prepared using the method of the invention with different thicknesses: 45-50 µm to 250 µm.
Figure 9:
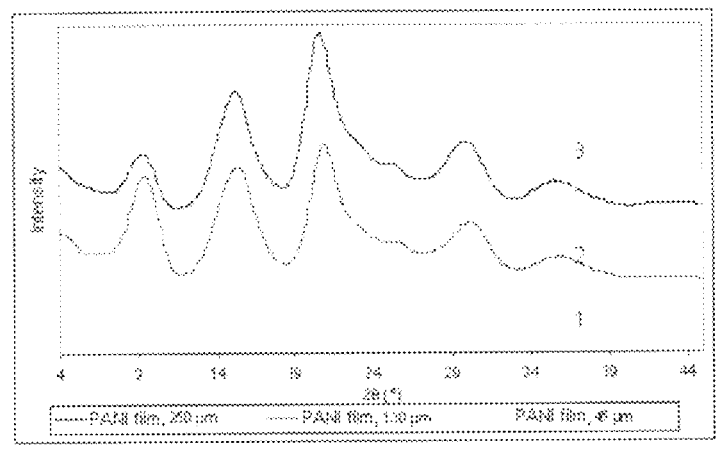
FIG. 9 shows a WAXS diffractogram of the surface formed in contact with air for films of PANI of different thicknesses: 45-50 µm to 250 µm.

Films of PANI with a thickness of 45 to 250 µm obtained using the method of Example 1 were analyzed by x ray diffraction in reflection mode, a) for the surface of the film formed in contact with the glass (FIG. 8) and b) for that in contact with air (FIG. 9).

The diffractograms of the face of the film formed with the glass showed three major reflections at 9.3°, 15.1° and 20.7°, respectively corresponding to the following interplanar spacings: d=9.5, 5.8 and 4.3 Å. These three reflections were accompanied by other, more diffuse reflections of lower intensities at about 4.5° (20.3 Å), 25.3° (3.5 Å), 29.8 (3.0 Å) and 35.5° (2.5 Å). The peak at 25.3° was absent for a low thickness, while its relative intensity increased for high thicknesses.

It was observed that the degree of crystallinity varied only slightly with thickness. It was 73% for the 45 µm film, 79% for the 130 µm film and 72% for the 250 µm film.

WAXS diffractograms were also carried out on the face of the film formed in contact with air, as shown in FIG. 9. Three reflections, at 9.3°, 15.1° and 20.7° (d=9.5, 5.8 and 4.3 Å) were major. When the thickness of the film changed from 45 to 130 µm, the intensity of the first peak increased, then it reduced for a larger thickness. The intensity of the peak at 20.7° increased with thickness. Compared with the face of the film formed in contact with glass, the other face exhibited a peak at 25.3° (3.5 Å) which was much clearer, especially when the thickness increased.

Figure 10:
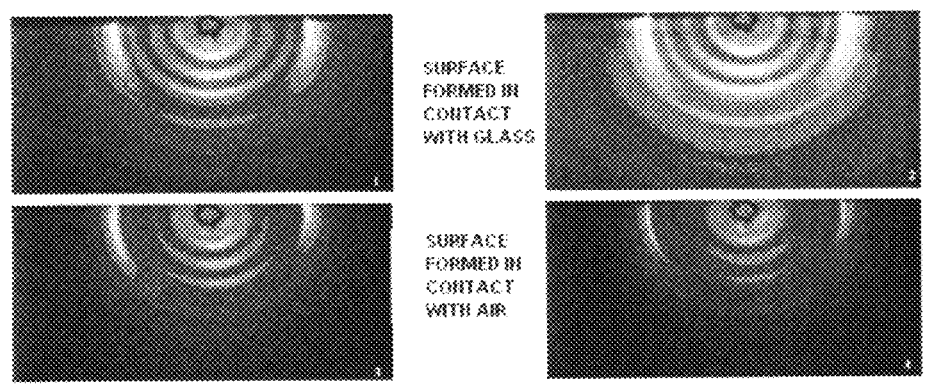
FIG. 10 shows two-dimensional WAXS diffractograms in glancing angle mode of the surface formed in contact with air and of the face in contact with glass for two PANI films of different thickness obtained by the method of the invention.

The retention of the orientation of the chains of PANI independent of the thickness of the film was confirmed by probes with two-dimensional WAXS in glancing angle mode for two films obtained in accordance with Example 1: a film 60 µm thick (images 1 and 3) and a film 130 µm thick (images 2 and 4) (FIG. 10).

EXAMPLE 11

Figure 11:
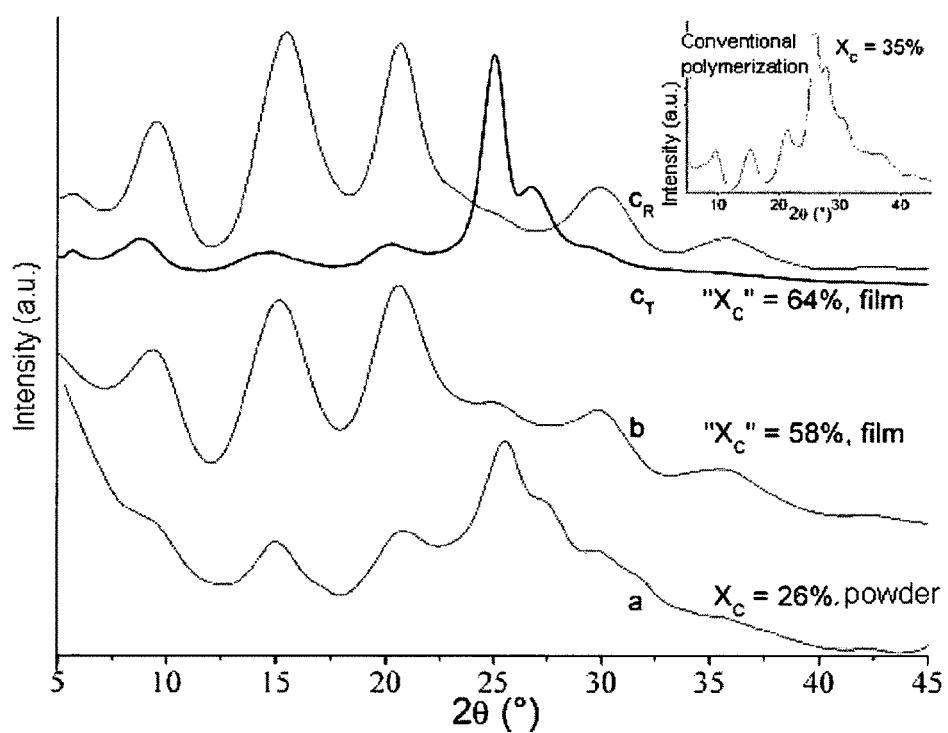
FIG. 11 shows diffractograms of polyaniline synthesized in accordance with the invention in the presence of NaCl (4.2 mol/L) at a temperature of: a) 25° C.; b) 0° C.; c) −27° C., and the diffractogram for normal PANI.

Polyaniline was synthesized in accordance with the method of Example 4, at different temperatures in the presence of NaCl (4.2 mol/L), polymerization being carried out at an aniline concentration of 0.01 mol/L and at a temperature: a) 25° C., b) 0° C., c) −27° C. in the form of a powder for a) and films for (b) and c)). FIG. 11 shows diffractograms for the synthesized polyaniline. The absence of a peak at 25.6° in the diffractogram obtained in reflection mode is significant of a strong alignment of π-π interactions parallel to the surface of the film: the peak at 25°, which corresponds to the phenyl inter-nucleus distance, appeared only in transmission mode and not in reflection mode (see cR and cT). It can be concluded that the phenyl nuclei are perpendicular to the surface of the film, which means that the π-π orientation is parallel to the film surface. Such an orientation has not been observed for powder samples. The electrical conductivity was of the order of 100 S/cm, while that for the powder samples obtained using the conventional method (HCl) was of the order of 1 to 5 S/cm.

"Conventional" PANI was obtained by "conventional polymerization", i.e. the method of Example 4 where formic acid was replaced by hydrochloric acid (see above, Ex 7 (2.4))).

EXAMPLE 12

Loss of Weight

For comparative purposes, a powder of amorphous PANT (1), a normal semi-crystalline powder (2) and a powder (3) derived from the method of the invention were prepared.

Figure 12:
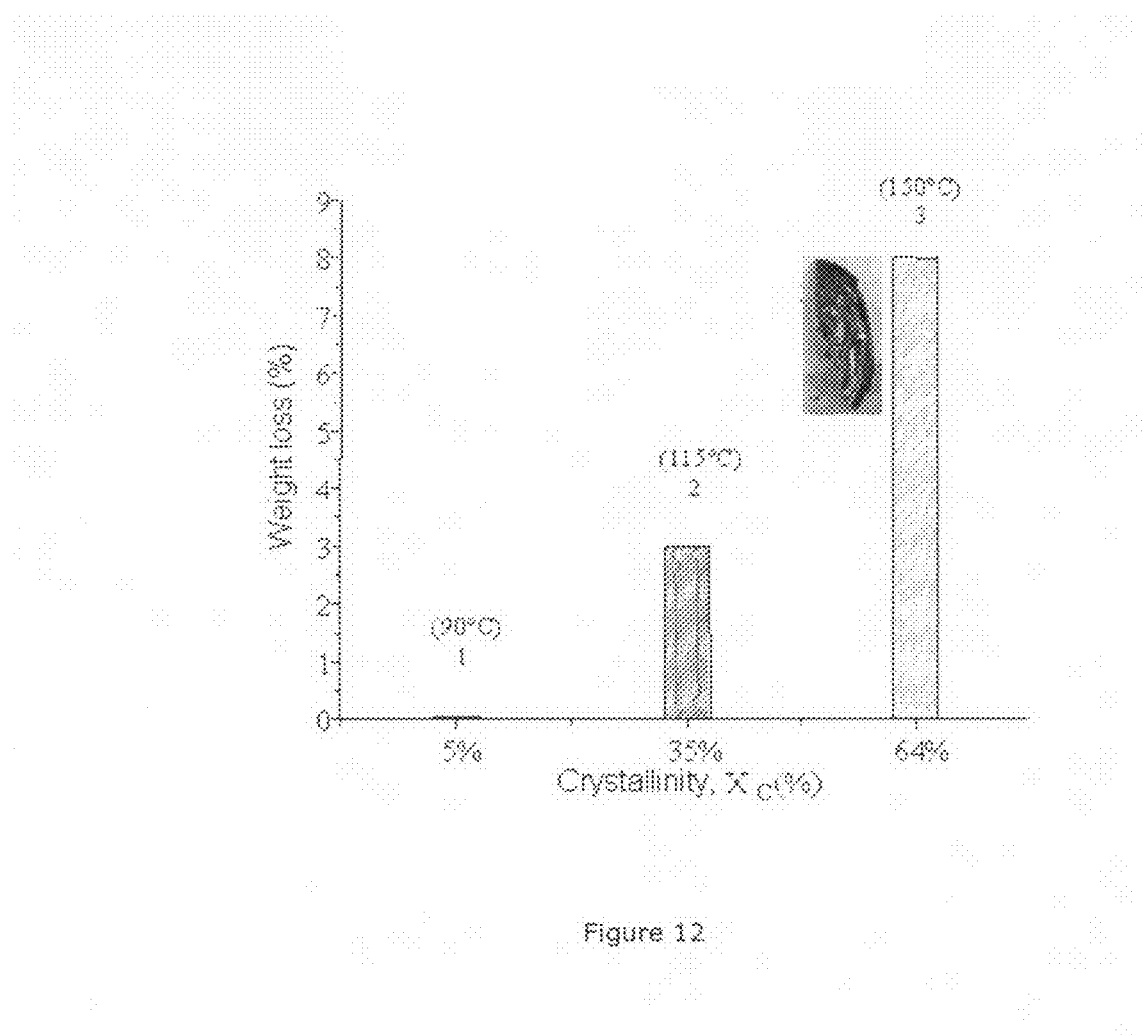
FIG. 12 shows the loss of water (% loss by weight) for PANI obtained in accordance with the invention (3), compared with amorphous PANI (1) or semi-crystalline (2) PANI, and their crystallinity.

FIG. 12 shows values for the weight loss measured at temperatures of the order of 25° C. to 200° C. for samples of PANI synthesized using different procedures as follows: the amorphous powder (1) was obtained in the presence of HCOOH (5 M)) in the absence of chloride; the "conventional" powder (2) was obtained in the presence of HCl (1.5 M); the powder of the invention (3) was obtained in accordance with Example 4. The three PANIs were obtained using the same concentration of aniline in the polymerization medium and dried under vacuum at 80° C.

For the amorphous PANI, there was no weight loss. Normal polymerization produced semi-crystalline powders; intercrystalline water evaporates off at 115° C.

The highest weight loss (approximately 9%) was observed for the films of PANI prepared in accordance with the present invention. This weight loss took place at 150° C.

It was observed that the arrangement of the chains of the PANI does not occur when HCl replaces formic acid, even at low temperature (−35° C.), regardless of whether it is with or without chloride (KCl, NaCl or LiCl). The crystallinity of these normal powders is less than 40%.

EXAMPLE 13

Oxidative polymerization of aniline was carried out in the presence of formic acid (5 M, pH=1.45) and lithium chloride, LiCl, in aqueous medium. The concentration of aniline introduced was 0.04 mol/L and the oxidizing agent employed was ammonium persulphate, introduced at the same concentration (0.04 mol/L in the polymerization medium) and the concentration of LiCl of the polymerization medium was 6.4 M.

The medium was homogenized.

The synthesis was carried out in a receptacle 12, at a temperature of −35° C. A 10 cm/5 cm glass plate 10 had been disposed therein.

The polymerization medium 13 remained liquid; only the PANI had precipitated over 2 to 3 hours. The powder 14 was deposited at the bottom and could be separated by filtering.

Example 13a

The plate 10 covered with PANI 15 was removed from the polymerization medium. The conversion of aniline to polyaniline was approximately 80% (when polymerization was complete, the PANI had precipitated at the bottom of the reaction medium and the suspension could be filtered through a filter paper and the suspension treated as in Example 1 in order to obtain thick films).

Thin Films

The support covered with PANI was removed after a residence time of 10 min, the thin film 15 carried by the plate 10 was rinsed (R) with a 5 mol/L solution of formic acid, then dried (S) (30 min at 80° C.).

A film of PANI with a thickness of 40 nm was obtained. The thickness of the film was determined using an atomic force microscope (AFM) in intermittent contact (tapping) mode.

Example 13b

For a residence time of 30 min, for an identical glass plate under identical rinsing and drying conditions to those of Example 1a, a thickness of 80 nm was obtained.

EXAMPLE 14

1. Method and Apparatus
   a) Film thickness: this was determined using AFM in tapping mode.
   b) Two-dimensional X ray diffraction (FIG. 14) was carried out on line BM26 of the ESF (European Synchrotron Facility) in Grenoble, using an energy of 10 KeV (ĕ=1.24 Å).

2. Results

The thin films obtained in Example 13a were characterized by tapping mode atomic force microscopy (AFM-TP). The measurements were carried out on a Digital Instruments Multimode instrument with Veeco Super Sharp tips (model TESP-SS) with a radius of curvature of 2 nm. The images were produced at ambient temperature in air.

Figure 14:

FIG. 14 is a diffractogram of the film obtained in Example 13b.

The films obtained were highly organized and transparent. According to the results of the two-dimensional X ray diffraction detected in the thickness of the film (the beam was parallel to the film surface), the direction of the π-π interactions was parallel to the film surface (FIG. 14). The degree of crystallinity of the films was more than 80%.

EXAMPLE 15

Measurement of Transparency

Figure 15A:
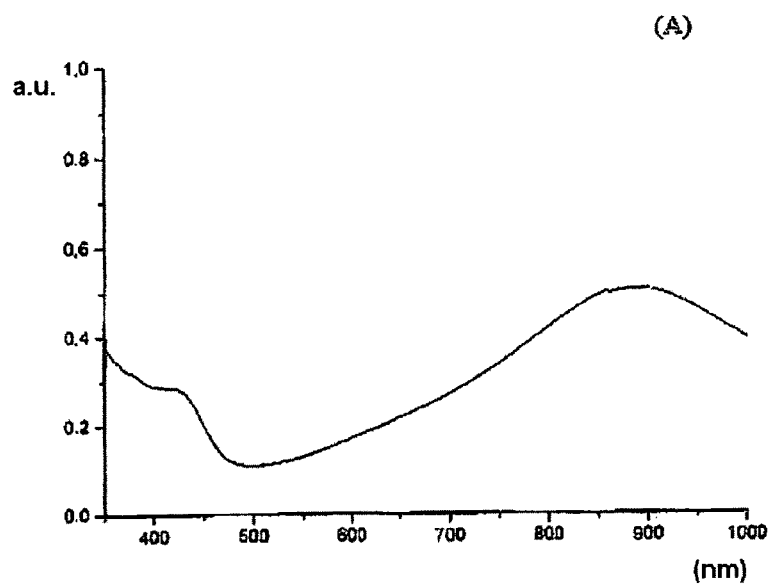
Figure 15B:
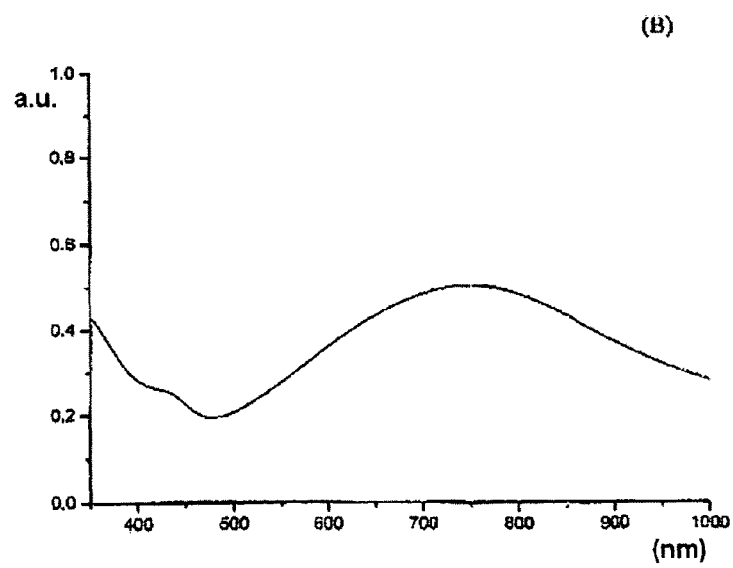

FIG. 15 shows the optical absorption spectra of the PANI film obtained in Example 13b with a thickness of 80 nm, without drying (A) and when dried (B) at 80° C. for 10 min.

The minimum transparency of this film at wavelengths of about 800 nm was of the order of 40%.

For a film with a thickness of 40 nm, as obtained in Example 13a, this value was 85%.

EXAMPLE 16

Glass or mica supports, silicon plates and PET film were used to deposit thin films in accordance with Example 12.

The crystallinity, orientation and transparency of the films obtained were not affected.

EXAMPLE 17

Reversible Reduction

Figure 16:
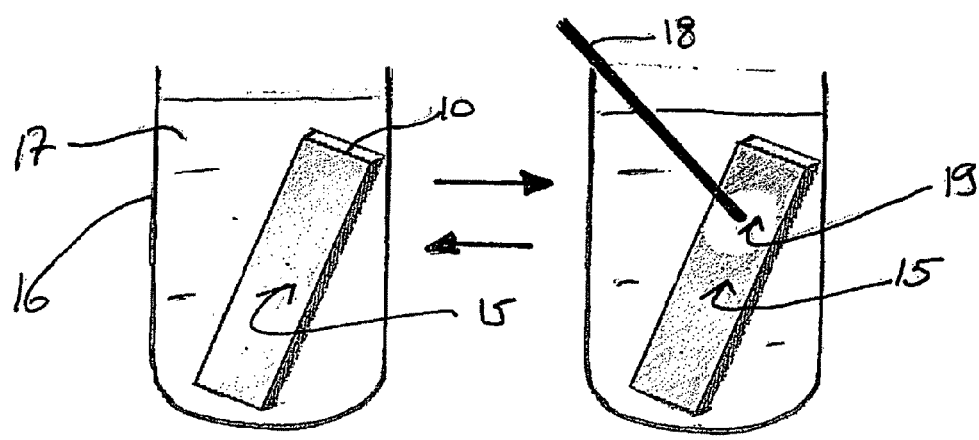

As can be seen in FIG. 16, the PANI film 15 obtained on plate 10 as per Example 13a could be reversibly decolourized by simple contact with a rod of steel 18 as soon as it was immersed in a solution in aqueous medium 17 at a pH of less than 3.

This decolourization propagated in a few seconds, forming a decolorized disk 19 around the point of impact of the rod 18 on the deposit 15. When the rod was withdrawn from the surface of the film 15, a return to the initial colour of the thin film 15 was observed.

COMPARATIVE EXAMPLE 18

The "conventional" PANI was obtained by "conventional polymerization", i.e. the method of Example 13a was reproduced, formic acid being replaced with hydrochloric acid.

The layer deposited on the support at the end of said polymerization did not exhibit propagation of colour in contact with a steel rod in an acid medium, i.e. did not exhibit the same phenomenon of reversible reduction in contact with a steel rod in an acid medium. It was not orientated.

The invention claimed is:
1. A method for preparing a film of on polyanilines a solid support comprising:
   (1) oxidative polymerization in an aqueous acid polymerization medium comprising a) an aniline monomer of formula (An) $R_m R_o$ —$C_6H_3$ —NHR', in which $R_m$, $R_o$ and R', independently of each other, represent H or a linear or branched alkyl, alkoxy, alkylcarboxy or alkylsufonic group containing 1 to 6 carbon atoms, b) an acid, c) an oxidizing agent and d) a salt of formula $MX_x$ in which M represents Li, Ca, Na, or K and X represents Cl and x represents 1 or 2 depending on the valency of M, wherein the acid is formic acid and the polymerization takes place in the presence of formic acid and said Cl salt to obtain polyanilines; and (2a) depositing said polyanilines on said solid support immersed in the polymerization medium to form a film adhering to said support; or (2b) separating said polyanilines, washing the separated polyanilines with an aqueous solution of an acid which is formic acid, sulphuric acid, sulphonic acid, phosphoric acid, acetic acid or a mixture of any two or more of the foregoing and depositing the washed polyanilines on said support to form a free-standing film;

wherein the polyanilines of the formed film are at least 80% crystalline and strongly oriented without dissolving said polyanilines in an organic solvent, to obtain a solution, casting of the resulting solution on the support and stretching the resulting film.

2. The method according to claim 1, wherein the monomer is aniline, $C_6H_5-NH_2$.

3. The method according to claim 1, wherein the oxidizing agent is selected from the group consisting of ammonium persulphate $(NH_4)_2S_2O_8$, $Kr_2Cr_2O_7$, $KIO_3$, $KMnO_4$, and mixtures of any two or more of the foregoing.

4. The method according to claim 1, wherein the oxidizing agent/monomer ratio is from about 0.5:1 to about 5:1.

5. The method according to claim 1, wherein the concentration of the aniline monomer in the polymerization medium is in a stoichiometric oxidizing agent/aniline ratio.

6. The method according to claim 1, wherein the concentration of aniline in the polymerization medium is from about 0.001 to about 0.2 mol/L.

7. The method according to claim 1, wherein the Cl salt is NaCl, LiCl, KCl, $CaCl_2$, or a mixture of any two or more of the foregoing.

8. The method according to claim 1, wherein the Cl salt is LiCl.

9. The method according to claim 1, wherein the concentration of Cl salt in the polymerization medium is in the range from about 2 to about 7 mol/L.

10. The method according to claim 1, wherein the pH of the polymerization medium is 2 or less.

11. The method according to claim 1, wherein the concentration of formic acid in the polymerization medium is in the range from about 0.5 to about 15 mol/L.

12. The method according to claim 1, wherein the polymerization is followed by a step of drying the polyaniline (PANI) obtained in the polymerization step on the solid support at a temperature in the range from about 5° C. to about 140° C.

13. The method according to claim 1, wherein in step (2a) the solid support comprises at least one flat surface, is disposed in the polymerization medium, and the support carrying the film is recovered.

14. The method according to claim 1, wherein the surface of the support is hydrophilic, the hydrophilic nature being defined by an angle of contact θ of 80° or less, using water as the liquid for measuring the angle.

* * * * *